(12) United States Patent
Ma et al.

(10) Patent No.: US 9,105,654 B2
(45) Date of Patent: Aug. 11, 2015

(54) SOURCE/DRAIN PROFILE FOR FINFET

(75) Inventors: Ta-Chun Ma, Hsin-Chu (TW);
Cheng-Hsien Wu, Hsin-Chu (TW);
Chih-Hsin Ko, Fongshan (TW);
Clement Hsingjen Wann, Carmel, NY (US)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 481 days.

(21) Appl. No.: 13/426,106

(22) Filed: Mar. 21, 2012

(65) Prior Publication Data
US 2013/0248948 A1    Sep. 26, 2013

(51) Int. Cl.
*H01L 29/78* (2006.01)
*H01L 21/336* (2006.01)
*H01L 29/66* (2006.01)

(52) U.S. Cl.
CPC ...... *H01L 29/66636* (2013.01); *H01L 29/7833* (2013.01); *H01L 29/7848* (2013.01)

(58) Field of Classification Search
None
See application file for complete search history.

(56) References Cited

U.S. PATENT DOCUMENTS

| | | |
|---|---|---|
| 2006/0086977 A1 | 4/2006 | Shah et al. |
| 2007/0001173 A1 | 1/2007 | Brask et al. |
| 2007/0205459 A1 | 9/2007 | Cho et al. |
| 2009/0026505 A1* | 1/2009 | Okano .......................... 257/255 |
| 2010/0065887 A1 | 3/2010 | Goebel et al. |
| 2011/0278676 A1* | 11/2011 | Cheng et al. .................. 257/369 |

FOREIGN PATENT DOCUMENTS

| | | |
|---|---|---|
| KR | 100668511 B1 | 1/2007 |
| KR | 100879653 B1 | 5/2007 |
| KR | 20070090375 A | 9/2007 |
| WO | WO 2007/002426 A2 | 1/2007 |

OTHER PUBLICATIONS

KR Office Action for corresponding KR Application No. 10-2012-0055626, dated Jul. 10, 2013, 10 pages (including translation).

\* cited by examiner

*Primary Examiner* — Robert Carpenter
(74) *Attorney, Agent, or Firm* — Slater & Matsil, L.L.P.

(57) ABSTRACT

An embodiment is a FinFET device. The FinFET device comprises a fin, a first source/drain region, a second source/drain region, and a channel region. The fin is raised above a substrate. The first source/drain region and the second source/drain region are in the fin. The channel region is laterally between the first and second source/drain regions. The channel region has facets that are not parallel and not perpendicular to a top surface of the substrate.

17 Claims, 16 Drawing Sheets

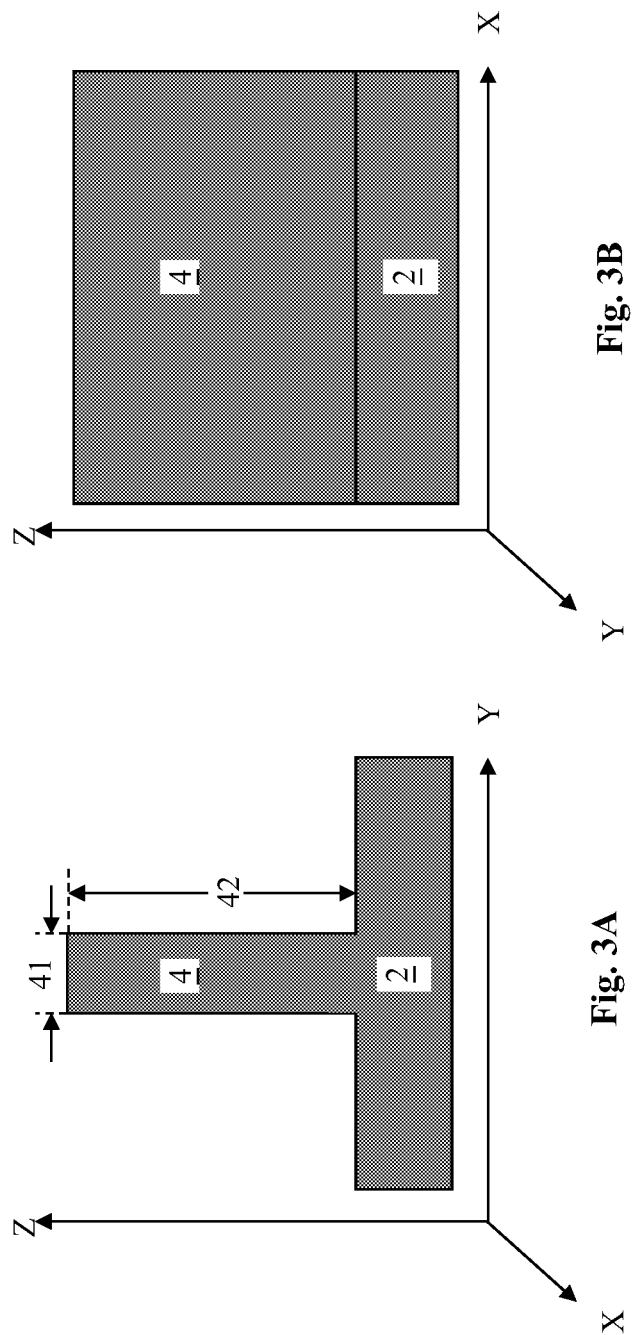

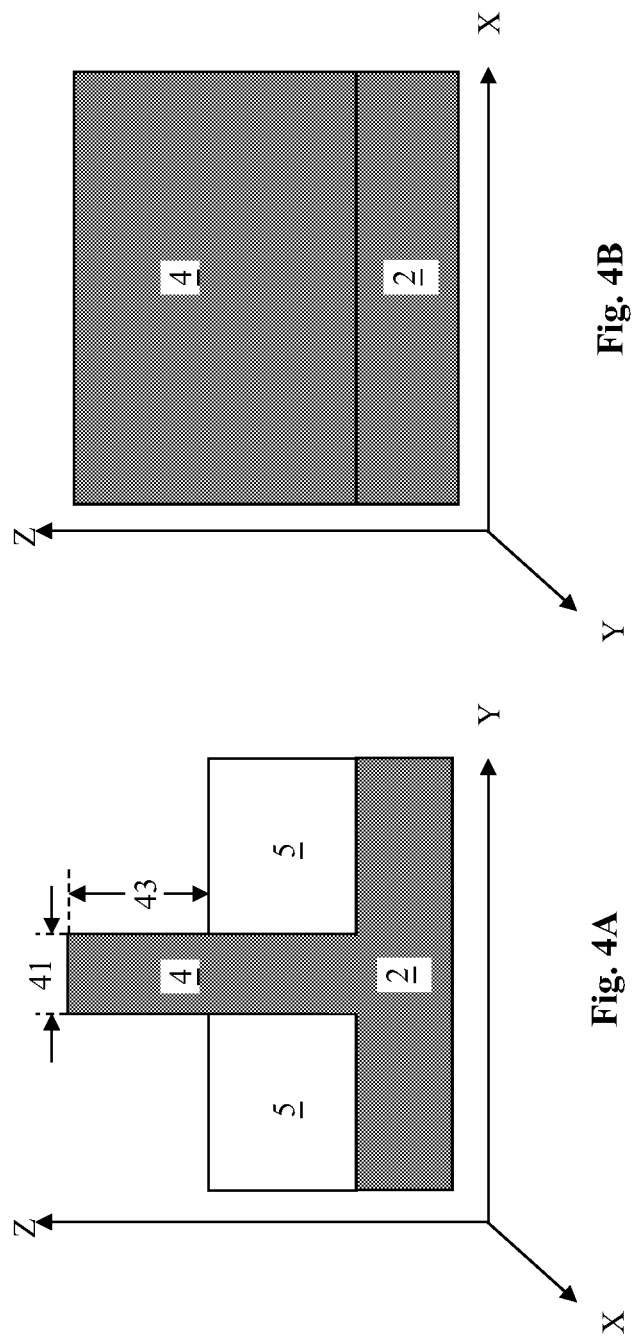

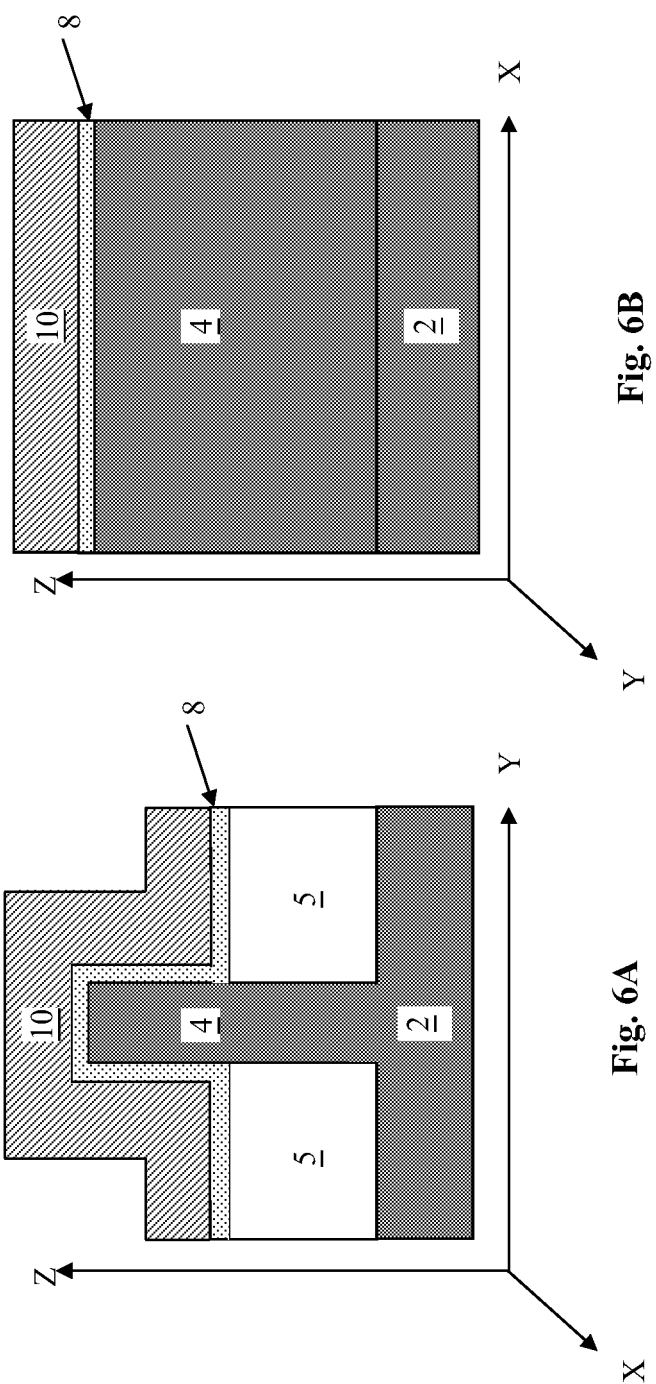

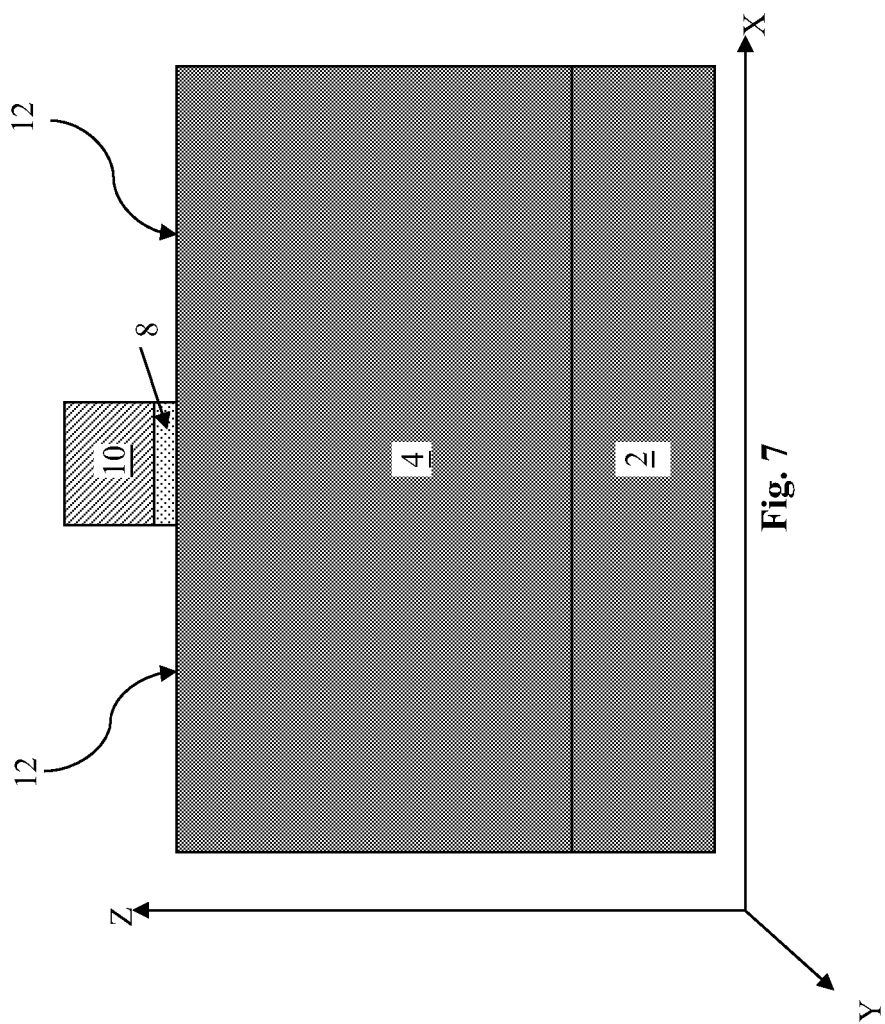

SOURCE/DRAIN PROFILE FOR FINFET

BACKGROUND

Transistors are key components of modern integrated circuits. To satisfy the requirements of increasingly faster speed, the drive currents of transistors need to be increasingly greater. Since the drive currents of transistors are proportional to gate widths of the transistors, transistors with greater widths are preferred.

The increase in gate widths, however, conflicts with the requirements of reducing the sizes of semiconductor devices. Fin field-effect transistors (FinFET) were thus developed.

The introduction of FinFETs has the advantageous feature of increasing drive current without the cost of occupying more chip area. However, the small size of FinFET transistors raises numerous issues during their production and manufacturing.

BRIEF DESCRIPTION OF THE DRAWINGS

For a more complete understanding of the present embodiments, and the advantages thereof, reference is now made to the following descriptions taken in conjunction with the accompanying drawings, in which:

FIGS. 2A through 16 are cross section views during processing to form a FinFET device according to an embodiment.

DETAILED DESCRIPTION OF illustrative embodiments

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Embodiments will be described with respect to a specific context, namely a FinFET device and structure having a faceted channel region and faceted source and drain regions. Other embodiments may also be applied, however, to structures having similar geometries in a planar device.

Figure 1:
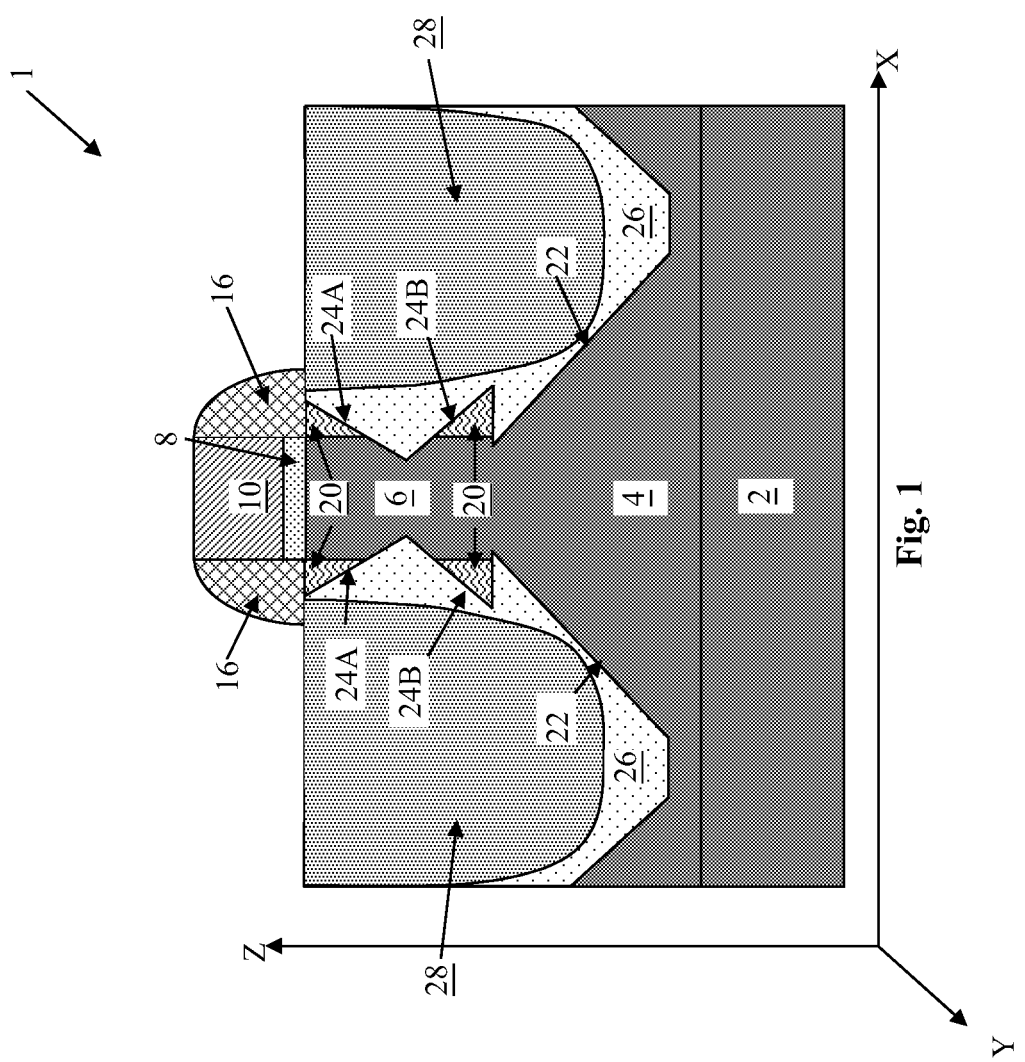
FIG. 1 is a is a cross section view of a FinFET device according to an embodiment.

FIG. 1 shows a FinFET device 1 according to an embodiment. The FinFET device 1 includes a substrate 2, a fin 4, a channel region 6, etch control sections 20 on opposites sides of the channel region 6, channel facets 24A and 24B, source/drain facets 22, source/drain structures comprising lightly doped regions 26 and heavily doped regions 28, gate 10 over gate dielectric 8, and gate spacers 16 along sidewalls of gate 10 and gate dielectric 8. In this embodiment, the substrate 2 may be silicon and, in other embodiments, includes silicon germanium (SiGe), silicon carbide, the like, or a combination thereof. In an embodiment, the top surface of the substrate 2 may have a (100) crystalline orientation. A fin 4 may be formed by patterning the substrate 2 or by growing the fin 4 in trenches on the substrate 2. The gate 10 and gate dielectric 8 are over the channel region 6.

The channel region 6 has concave sidewalls which form a tapered or hourglass shape. The concave sidewalls of the channel region 6 comprise channel facets 24A and 24B with a length 44 (see FIG. 12), between the intersections of a channel facet 24A and the respective channel facet 24B, being smaller than a gate length 45 (see FIGS. 11 & 12). The channel facets 24A and 24B are not parallel and not perpendicular to the top surface of the substrate 2 and may have a substantially (111) crystalline orientation.

The etch control sections 20 are below the gate spacers 16 on opposite sides of the channel region 6 and form portions of the channel facets 24A and 24B. In this embodiment, the etch control sections 20 are four separate sections substantially triangular in shape. In other embodiments, the etch control sections 20 may be two sections on opposites sides of the channel region 6 with concave outer sidewalls. The etch control sections 20 in this embodiment may be doped through an implantation process, using the gate 10 as a mask, to introduce boron ions at a concentration from $8e^{19}$ ions/cm$^3$ to $2e^{20}$ ions/cm$^3$.

The source/drain structures are formed on opposite sides of the channel region 6. The source/drain structures may be formed by a multi-step process to form the source/drain facets 22 and the channel facets 24A and 24B. The process may begin with recesses being formed on the outer sides of the etch control sections 20 using the gate 10 and gate spacers 16 as a mask. Next, an anisotropic wet etch process with tetramethylammonium hydroxide (TMAH) or the like as the etchant may be performed. This wet etch process forms the source/drain facets 22 and may undercut the etch control sections 20 and the channel region 6 while leaving the etch control sections 20 largely unaffected. In an embodiment, the source/drain facets 22 may have a (111) crystalline orientation. Another etch process may be performed to remove large portions of the etch control sections 20 forming the channel facets 24A and 24B and further undercutting the channel region 6. In this embodiment, the etch process may be an anisotropic etch process with HCl or Cl$_2$ as the etchant. This etch process forms the tapered or hourglass shape of the channel region 6.

The lightly doped regions 26 and the highly doped regions 28 are formed in the recesses that include the channel facets 24A and 24B and source/drain facets 22 to provide a stress on the channel region 6. The lightly doped regions 26 may be formed of SiGe lightly doped with boron. The highly doped regions 28 may be formed of SiGe heavily doped with boron. In an embodiment, the lightly doped regions 26 may be doped at a concentration between about $8e^{19}$ ions/cm$^3$ and $2e^{20}$ ions/cm$^3$ and the highly doped regions 28 may be doped at a concentration between about $1e^{20}$ ions/cm$^3$ and $3e^{20}$ ions/cm$^3$.

FIGS. 2A through 16 illustrate a process to form a FinFET device 1 according to an embodiment. Although this embodiment is discussed with steps performed in a particular order, steps may be performed in any logical order.

FIGS. 2 through 6 each include two cross-sectional views of the FinFET device 1 at an intermediate stage of processing. The first cross-sectional view (e.g. 2A, 3A, etc.) is along the Z-Y plane while the second cross-sectional view (e.g. 2B, 3B, etc.) is along Z-X plane. FIGS. 7 through 16 include only a cross-sectional view along the Z-X plane.

Figure 2B:
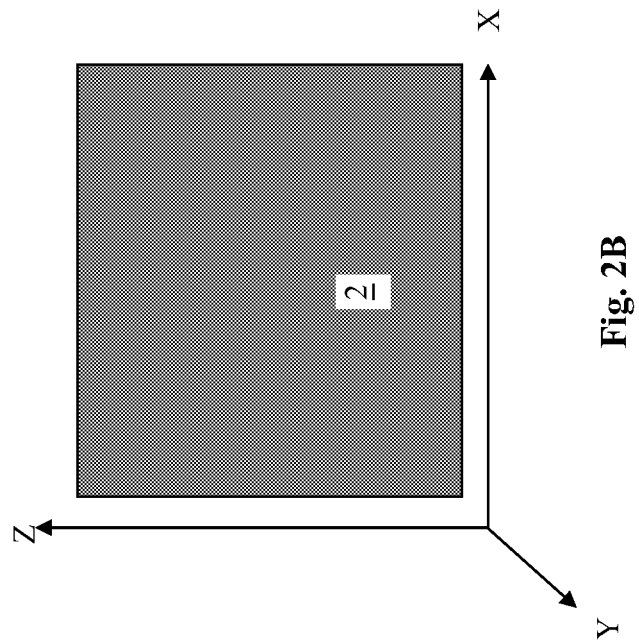
Figure 2A:
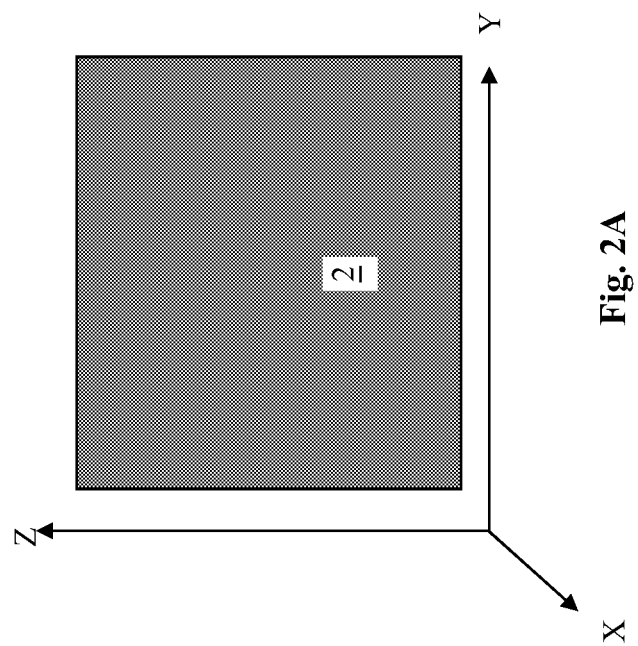

FIGS. 2A and 2B illustrate cross-sectional views of a substrate 2 at an intermediate stage of processing. The substrate 2 may be silicon, SiGe, silicon carbide, the like, or a combination thereof. The substrate 2 may comprise bulk silicon, doped or undoped, or an active layer of a silicon-on-insulator (SOI) substrate. In an embodiment, the top surface of the substrate 2 may have a (100) crystalline orientation. Other substrates that may be used include multi-layered substrates, gradient substrates, or hybrid orientation substrates.

The substrate 2 may include active and passive devices (not shown). As one of ordinary skill in the art will recognize, a wide variety of active and passive devices such as transistors, capacitors, resistors, combinations of these, and the like may be used to generate the structural and functional requirements of the design for the FinFET device 1. The active and passive devices may be formed using any suitable methods.

The substrate 2 may also include metallization layers (not shown). The metallization layers may be formed over the active and passive devices and are designed to connect the various active devices to form functional circuitry. The metallization layers (not shown) may be formed of alternating layers of dielectric (e.g., low-k dielectric material) and conductive material (e.g., copper) and may be formed through any suitable process (such as deposition, damascene, dual damascene, etc.). The metallization and dielectric layers may include metal lines and vias (not shown) to electrically couple the active and passive devices to the FinFET device 1 (see FIG. 1). Only a portion of the substrate 2 is illustrated in the figures, as this is sufficient to fully describe the illustrative embodiments.

In FIGS. 3A and 3B, the patterning of the substrate 2 into the fin 4 is illustrated. The fin patterning process may be accomplished by depositing mask material (not shown) such as photoresist or silicon oxide over the substrate 2. The mask material is then patterned and the substrate 2 is etched in accordance with the pattern. The resulting structure includes fin 4 formed in the substrate 2. The fin 4 has sidewalls being substantially orthogonal to a top surface of the substrate 2. In some embodiments, the substrate 2 is etched to a specific depth, meaning the fin 4 is formed to a height 42 from about 50 nm to about 180 nm. The fin 4 may have a width 41 from about 6 nm to 16 nm. In an alternative embodiment, the fin 4 may be epitaxially grown from a top surface of substrate 2 within trenches or openings formed in a patterned layer atop substrate 2. Because the process is known in the art, the details are not repeated herein.

The fin 4 serves as the fin structure for the to-be-formed FinFET device 1. The FinFET device 1 may comprise a single fin 4 to as many fins 4 as necessary for the FinFET device 1. FIGS. 2A through 16 illustrate the formation of a FinFET device 1 with one fin 4 as a non-limiting illustrative embodiment.

Referring now to FIGS. 4A and 4B, a dielectric layer 5 is deposited in the gaps surrounding the fin 4. The dielectric layer 5 can be silicon oxide, the like, or a combination thereof, formed by chemical vapor deposition (CVD), spin-on dielectric (SOD), the like, or a combination thereof. The process of gap filling the dielectric layer 5 in the gaps surrounding the fin 4 may be performed in a variety of ways. In one embodiment, the dielectric layer 5 is blanket deposited over the fin 4 and the substrate 2. The dielectric layer 5 may then be thinned back to the top of the fin 4 by a chemical mechanical polishing (CMP) process. The dielectric layer 5 may be thinned to below the top of the fin 4 by a diluted hydrofluoric acid (DHF) treatment or a vapor hydrofluoric acid (VHF) treatment for a suitable time. In another embodiment, the CMP process step may be skipped and the dielectric layer 5 may be selectively thinned back without removing the fin 4 by a DHF or a VHF treatment. In an embodiment, the dielectric layer 5 may be thinned back to form a height 43 of the fin 4 above the dielectric layer 5 from about 10 nm to 25 nm.

Figure 5A:
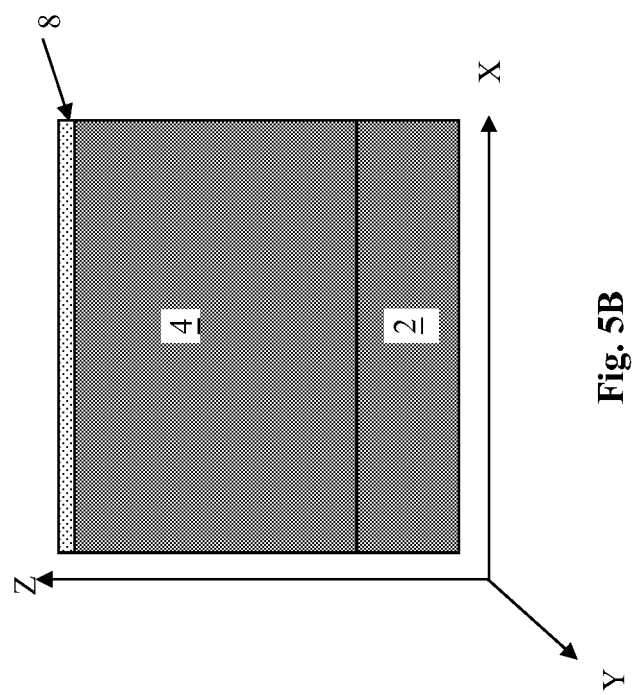
Figure 5B:
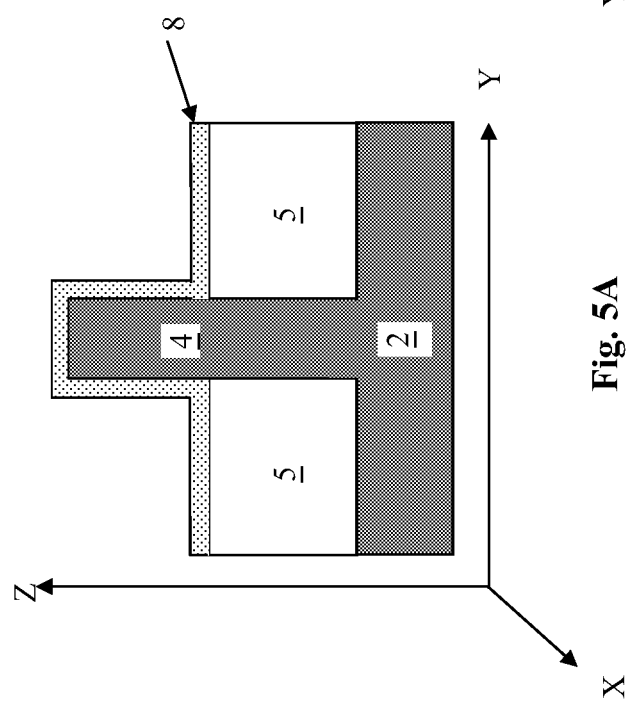

FIGS. 5A and 5B illustrate the formation of a gate dielectric layer 8 on the top surface and sidewalls of the fin 4 and the top surface of the dielectric layer 5. The gate dielectric 8 may be formed by thermal oxidation, CVD, sputtering, or any other acceptable methods for forming a gate dielectric. In an embodiment, the gate dielectric layer 8 includes dielectric materials having a high dielectric constant (k value), for example, greater than 3.9. The materials may include silicon nitrides, oxynitrides, metal oxides such as $HfO_2$, HfZrOx, HfSiOx, HfTiOx, HfAlOx, the like, or a combination thereof. In another embodiment, the gate dielectric layer 8 may have a capping layer from metal nitride materials such as titanium nitride, tantalum nitride, or molybdenum nitride.

In FIGS. 6A and 6B, the formation of the gate electrode layer 10 on the gate dielectric layer 8 is illustrated. The gate electrode layer 10 comprises a conductive material and may be selected from a group comprising polycrystalline-silicon (poly-Si), poly-crystalline silicon-germanium (poly-SiGe), metallic nitrides, metallic silicides, and metals. Examples of metallic nitrides include tungsten nitride, molybdenum nitride, titanium nitride, and tantalum nitride, or a combination thereof. Examples of metallic silicide include tungsten silicide, titanium silicide, cobalt silicide, nickel silicide, platinum silicide, erbium silicide, the like, or a combination thereof. Examples of metal include tungsten, titanium, aluminum, copper, molybdenum, nickel, platinum, the like, or a combination thereof. The gate electrode layer 10 may be deposited by CVD, low-pressure chemical vapor deposition (LPCVD), the like, or a combination thereof. The top surface of the gate electrode layer 10 usually has a non-planar top surface, and may be planarized prior to patterning of the gate electrode layer 10 or gate etch. Ions may or may not be introduced into the gate electrode layer 10 at this point. Ions may be introduced, for example, by ion implantation techniques.

FIG. 7 illustrates the patterning the gate electrode layer 10 and the gate dielectric layer 8 to form the gate structure. The gate patterning process may be accomplished by depositing mask material (not shown) such as photoresist or silicon oxide over the gate electrode layer. The mask material is then patterned and the gate electrode layer is etched in accordance with the pattern.

Figure 8:
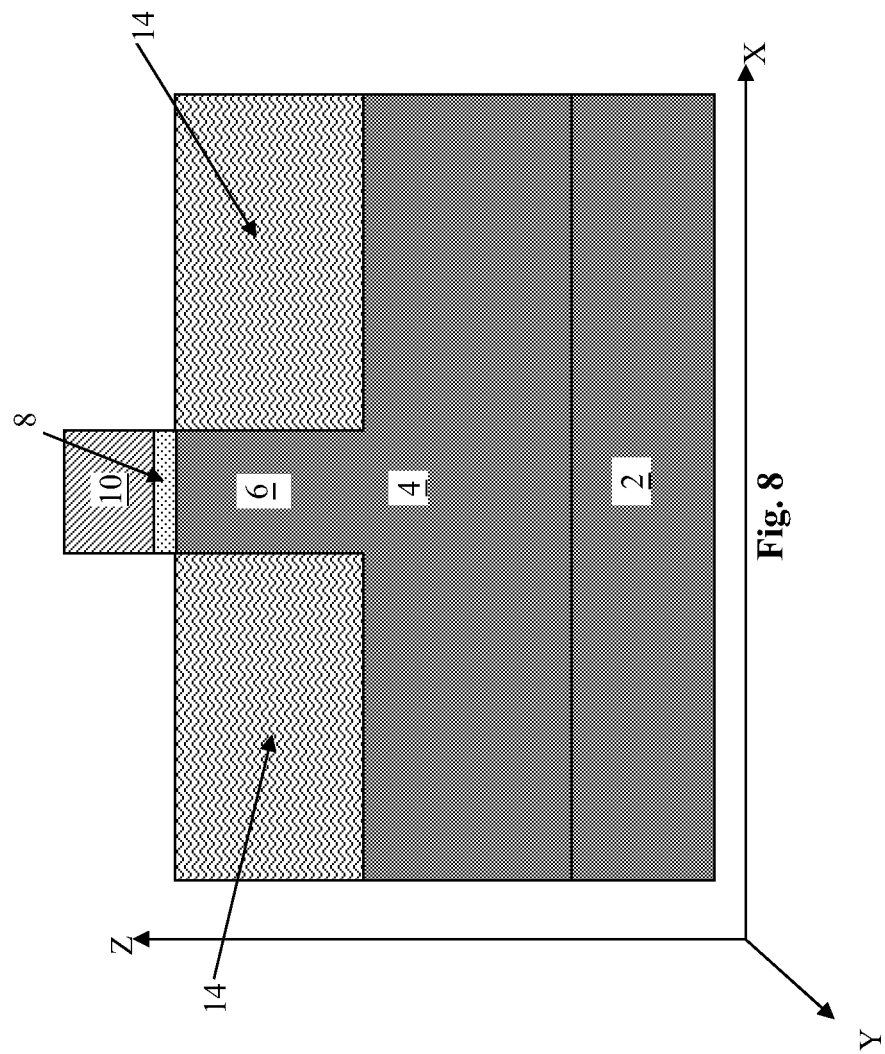

In FIG. 8, the fin 4 is doped to form doped regions 14. The fin 4 may be doped by performing an implantation process to implant dopants in to the fin 4. In an embodiment, the doped regions 14 may be doped with boron at a concentration between about $8e^{19}$ ions/cm$^3$ and $2e^{20}$ ions/cm$^3$. The doped regions 14 will subsequently form the etch control sections 20 (see FIG. 10).

Figure 9:
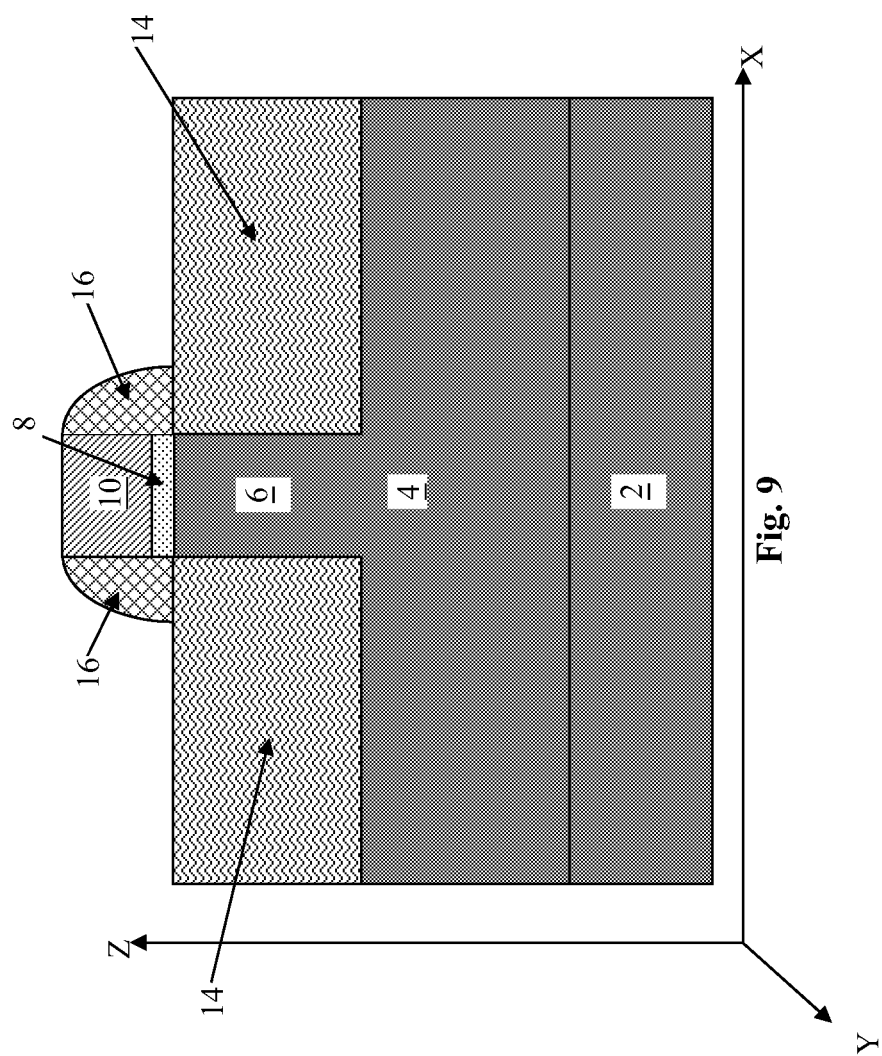

FIG. 9 illustrates the formation of the gate spacers 16 on opposite sides of the gate electrode layer 10 and the gate dielectric 8. The gate spacers 16 may be formed by blanket depositing a spacer layer (not shown) on the previously formed structure. The spacer layer may comprise SiN, oxynitride, SiC, SiON, oxide, the like, or a combination thereof and may be formed by methods utilized to form such a layer, such as CVD, atomic layer deposition (ALD), the like, or a combination thereof. The gate spacers 16 are then patterned by anisotropically etching to remove the spacer layer from the horizontal surfaces of the structure.

Figure 10:
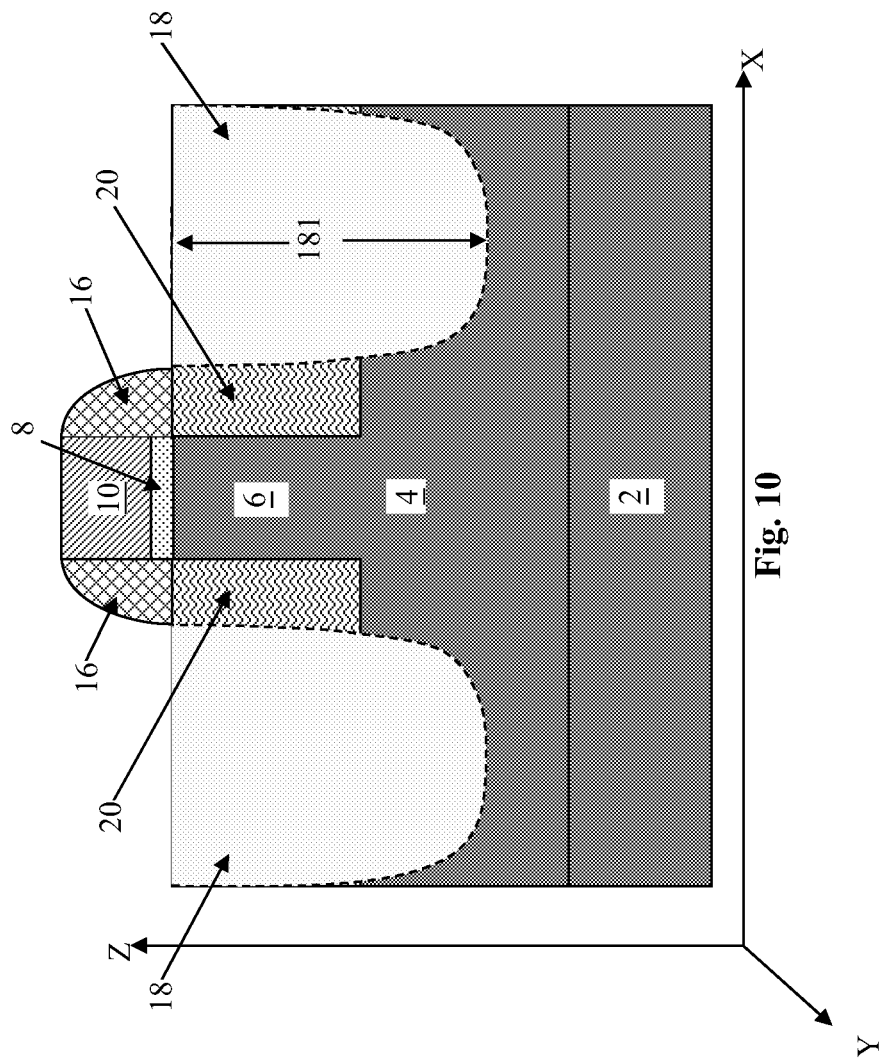

In FIG. 10, the formation of recesses 18 for the source/drain regions and the etch control sections 20 is illustrated. In an embodiment, the recesses 18 may be formed by a wet and/or dry etching process, such as an anisotropic etching process. The recesses 18 may be formed to a depth 181 from the top surface of the substrate 2. In an embodiment, the depth 181 may be from 1.5 to 2 times the height 43 (see FIG. 4A). The depth 181 of the recesses 18 may affect the location of the subsequent source/drain facets 22 in relation to the channel region 6 (see FIGS. 11 and 12). The etch control sections 20 are formed by the removal of the doped regions 14 except for that underneath the gate spacers 16. The etch control sections 20 may be utilized in to affect the etching profile for the subsequent etching processes.

Figure 11:
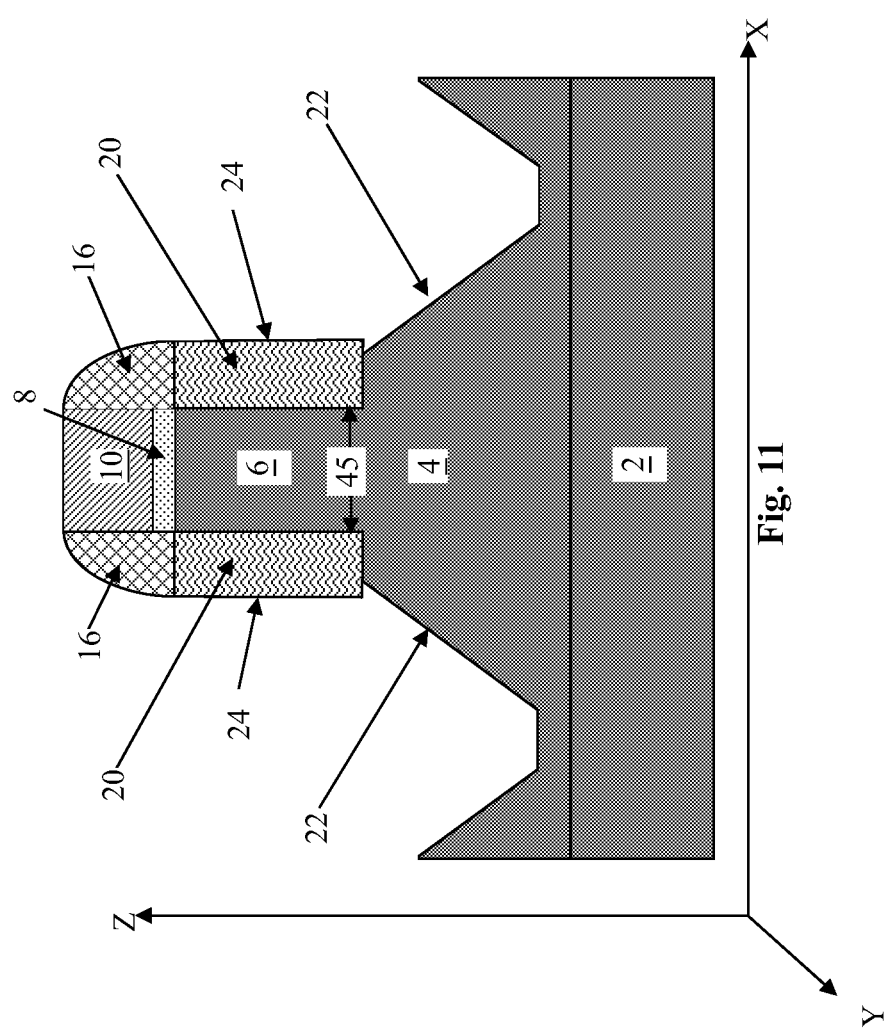

FIG. 11 illustrates the formation of the source/drain facets 22 and the etch control sections sidewalls 24 in the recesses 18. In an embodiment the source/drain facets 22 may be formed by an anisotropic wet etch process, wherein TMAH, ammonium, or the like may be used as an etchant. As a result of the etch process, the source/drain facets 22 may have a crystalline orientation of (111) which causes the source/drain facets 22 to diverge from each other when moving away from the channel region 6. In addition, the source/drain facets 22 may undercut the etch control sections 20 and the channel region 6.

The etch control sections 20 may have a different etch rate than the fin 4. For example, in an embodiment, the etch control sections 20 are highly doped with boron and the fin 4 comprises silicon. In this embodiment, the wet etch process with the etchant TMAH will etch the highly boron doped etch control sections 20 at a lower rate than the silicon fin 4. As a result of the etch process, the sidewalls 24 of the etch control sections 20 may be substantially perpendicular to a top surface of the substrate 2 and have a (110) crystalline orientation. The etch control sections 20 may be substantially unaffected by the etching process and may allow the etch process to undercut the channel region 6.

Figure 12:
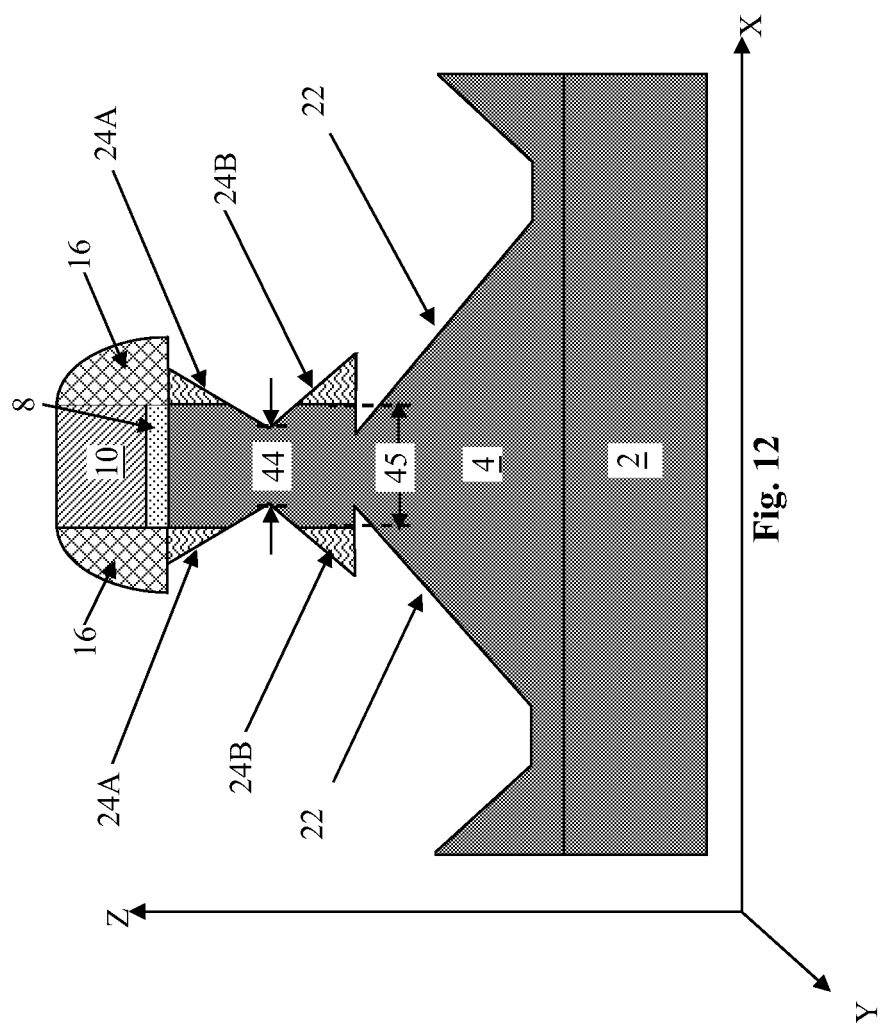

In FIG. 12, the removal of portions of the etch control sections 20 by another etch process is illustrated. In an embodiment, the removal of the portions of the etch control sections 20 is by an anisotropic etch process, wherein hydrochloric acid (HCl), chlorine ($Cl_2$), or the like may be used as an etchant. In an illustrative embodiment, the etch process may be performed at a temperature from about 600° C. to about 800° C., at a pressure from about 10 torr to about 250 torr, and with a precursor gas comprising $GeH_4$ or the like. The removal of the portions of the etch control sections 20 forms channel facets 24A and 24B which give a tapered or hourglass shape to the channel region 6. The channel facets 24A and 24B may not be parallel or perpendicular to the top surface of the substrate 2 and may have a substantially (111) crystalline orientation. Further, the etch process may further undercut the channel region 6 with the source/drain facets 22. The hourglass shape of the channel region 6 has an upper region, a lower region, and neck region. In an embodiment, the neck region may have a length 44 from about 0.5 to about 1 times the gate length 45. The upper region of the channel region 6 is defined by the channel facets 24A, and the lower region is defined by the channel facets 24B. The intersection of the channel facets 24A and 24B is in the neck region.

Figure 13:
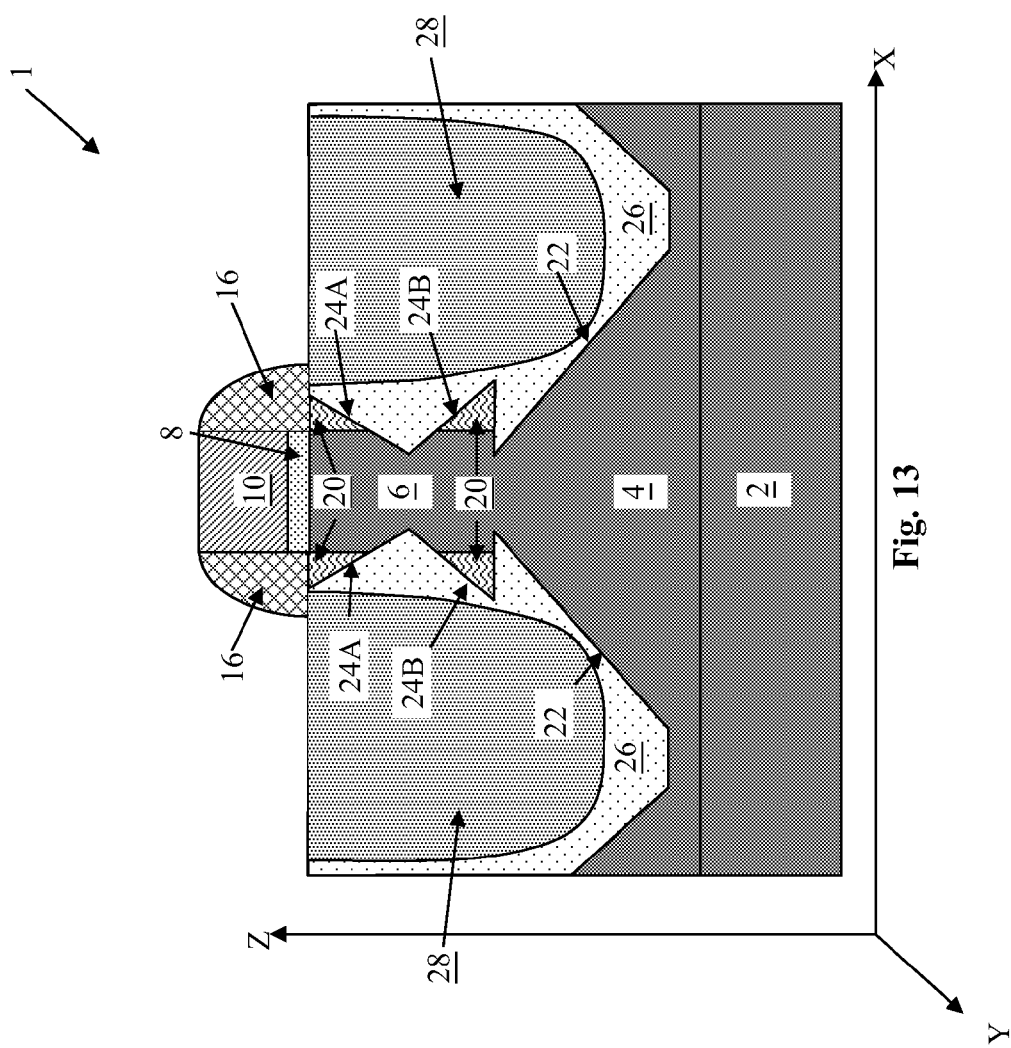

FIG. 13 illustrates the formation of the source/drain structures. The lightly doped regions 26 may be epitaxially grown in the recesses formed in the previous processing steps. The lightly doped regions 26 may be formed by selective epitaxial growth (SEG), CVD, the like, or a combination thereof and may be formed of a semiconductor material the same as, or a semiconductor material different from, that of the fin 4. In an embodiment, the lightly doped regions 26 may be formed of SiGe. In alternative embodiments, the lightly doped regions 26 may be formed of silicon, SiC, or the like. Depending on the desired composition of the lightly doped regions 26, the precursors for the epitaxial may include silicon-containing gases and germanium-containing gases, such as $H_2SiCl_2$, $SiH_4$, $GeH_4$, or the like, and the partial pressures of the silicon-containing gases and germanium-containing gases are adjusted to modify the atomic ratio of germanium to silicon. In an embodiment in which SiGe is used for forming the lightly doped regions 26, the resulting lightly doped regions 26 may be between about 0 atomic percent and about 100 atomic percent germanium. The lightly doped regions 26 may be doped either through an implantation method as discussed above, or else by in-situ doping as the material is grown. In an embodiment, the lightly doped regions 26 may be doped with boron at a concentration between about $8e^{19}$ ions/$cm^3$ and $2e^{20}$ ions/$cm^3$.

During the epitaxy process, etching gas, such as HCl gas, may be added (as an etching gas) into the process gas, so that the lightly doped regions 26 are selectively grown in the source/drain recesses, but not on other surfaces of the fin 4, the gate 10, or the dielectric layer 5. In alternative embodiments, no etching gas is added, or the amount of etching gas is small, so that there is a thin layer of the lightly doped regions 26 formed on the other surfaces of the fin 4, the gate 10, or the dielectric layer 5. In yet another embodiment, the fin 4, the gate 10, and the dielectric layer 5 could be covered with a sacrificial layer (not shown) to prevent epitaxial growth thereon.

After the lightly doped regions 26 are formed, the heavily doped regions 28 may be formed to complete the source/drain structures. The heavily doped regions 28 may be formed by SEG and the methods and materials above in reference to the lightly doped regions 26, although the heavily doped regions 28 and the lightly doped regions 26 need not be formed of the same materials or by the same methods. In an embodiment, the heavily doped regions 28 may be formed of SiGe. In alternative embodiments, the heavily doped regions 28 may be formed of silicon, SiC, the like, or a combination thereof. In an embodiment, the heavily doped regions 28 may be doped with boron at a concentration between about $1e^{20}$ ions/$cm^3$ and $3e^{20}$ ions/$cm^3$. As discussed above, the epitaxy process may include etching gas or a sacrificial layer to prevent epitaxial growth where it is not desired.

Figure 14:
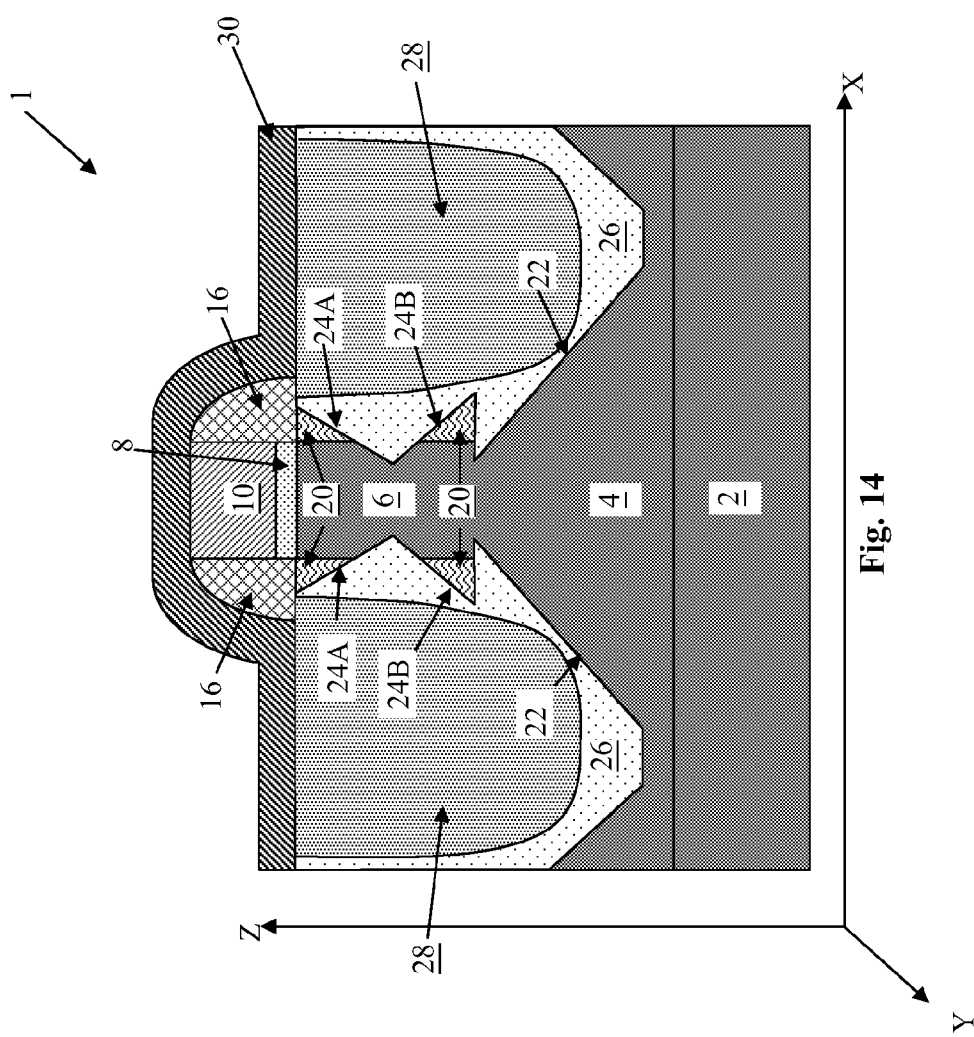

The lightly doped regions 26 and the heavily doped regions 28 may be grown to form a stressor that will impart a stress on the channel region 6. In an embodiment wherein the channel region 6 comprises silicon, the lightly doped regions 26 and the heavily doped regions 28 may then comprise silicon germanium which has a larger lattice constant than the silicon. The lattice mismatch between the stressor material in the source/drain structures and the channel region 6 will impart a compressive stress into the channel region 6 that will increase the carrier mobility and the overall performance of the device. In another embodiment wherein the channel region 6 comprises silicon germanium, the lightly doped regions 26 and the heavily doped regions 28 may comprise silicon germanium but at a higher atomic percent germanium to impart a stress on the channel region 6. For example, the channel region 6 may be between about 40 atomic percent and about 45 atomic percent germanium while the lightly doped regions 26 and the heavily doped regions 28 may be between about 50 atomic percent and about 60 atomic percent germanium FIG. 14 illustrates the formation of a etch stop layer (ESL) 30 over the top surface of the lightly doped regions 26, over the top surfaces of the heavily doped regions 28, along the sidewalls of the gate spacers 16, and over the gate 10. The ESL 30 is conformally deposited over components on the substrate 2. The ESL 30, in an embodiment, is silicon nitride, silicon oxide, silicon carbide, the like, or a combination thereof. The ESL 30 can be formed by CVD, flowable CVD, the like, or a combination thereof.

Figure 15:
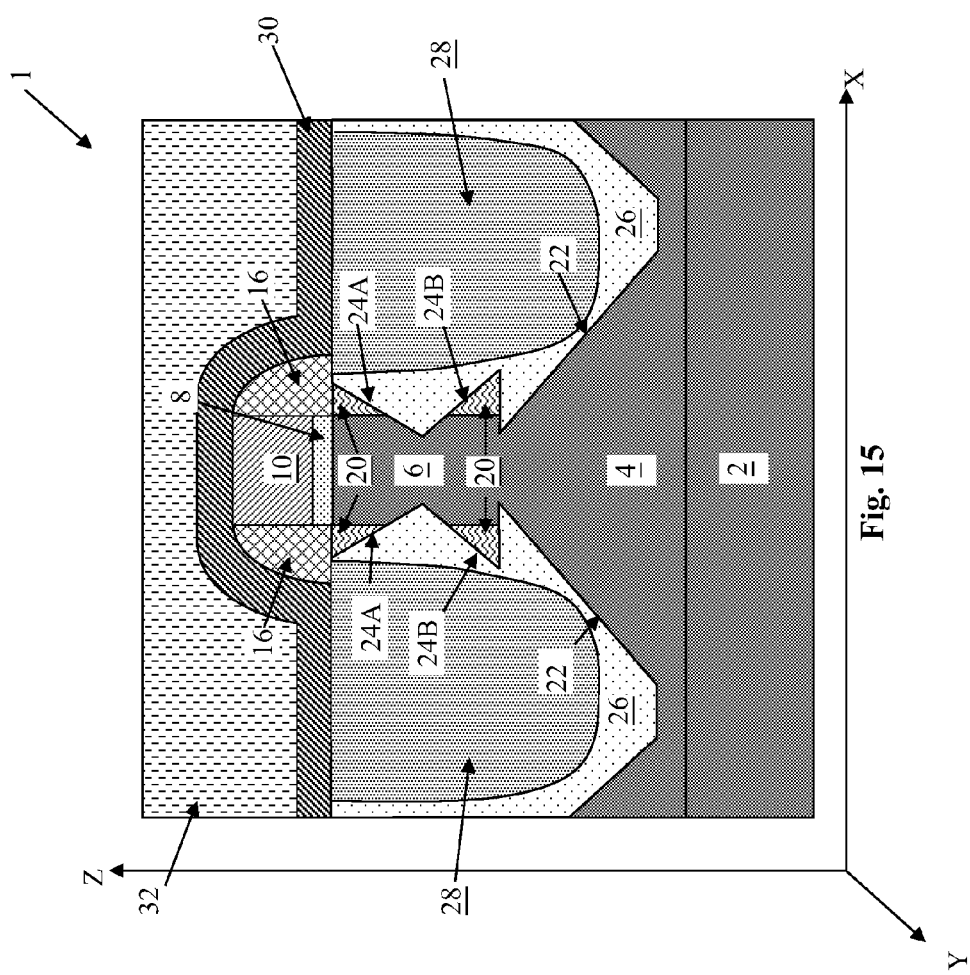

In FIG. 15, an inter-layer dielectric (ILD) 32 is formed over the ESL 30. The ILD 32, in an embodiment, is silicon oxide, a nitride, the like, or a combination thereof. The ILD 32 can be formed by CVD, a high density plasma (HDP), the like, or a combination thereof. Further, after depositing the ILD 32, the ILD 32 may be planarized, such as by using a CMP.

Figure 16:
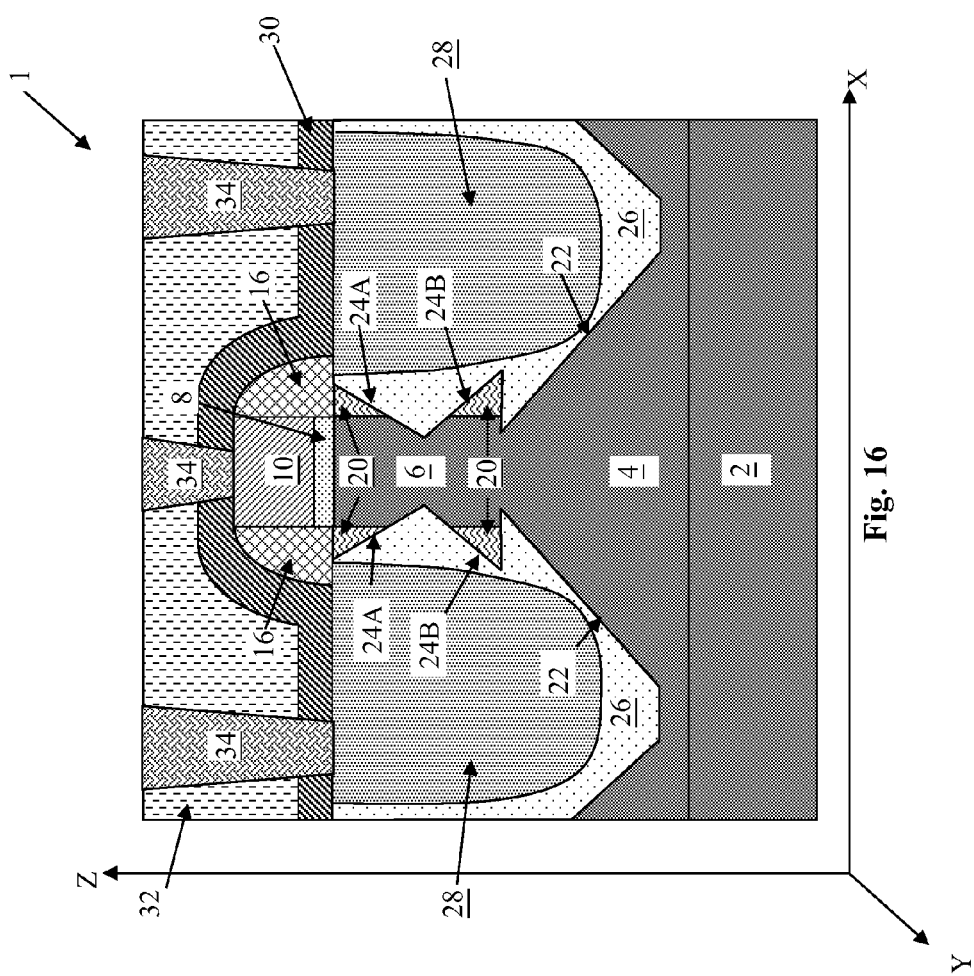

FIG. 16 illustrates the formation of contacts 34 to the source/drain structures and the gate 10. Openings may be etched through the ILD 32 and the ESL 30 to the source/drain structures and the gate 10. The openings can be etched using acceptable photolithography techniques, such a single or dual damascene process. It should be noted that acceptable photolithography techniques may use a first etchant to etch through the ILD 32 and a second etchant to etch through the ESL 30. Contacts 34 may then be formed in the openings. Forming the contacts 34 includes, for example, depositing a barrier layer such as titanium nitride, tantalum nitride, the like, or a combination thereof, and then depositing a conductive material, such as a metal like aluminum, copper, tungsten, the like, or a combination thereof, in the openings. The deposition may be by, for example, CVD, ALD, physical vapor deposition (PVD), the like, or a combination thereof. Excess barrier layer materials and/or conductive materials are removed, such as by CMP.

Metallization layers (not shown) may be formed on the ILD 32 and contacts 34. The metallization layers may be formed of alternating layers of dielectric (e.g., low-k dielectric material) and conductive material (e.g., copper) and may be formed through any suitable process (such as deposition, damascene, dual damascene, etc.). The metallization and dielectric layers may include metal lines and vias (not shown) to electrically couple active and passive devices to the FinFET device 1 (see FIG. 16).

Embodiments may achieve advantages. The channel facets 24A and 24B and the undercutting of the channel region 6 by the source/drain facets 22 may increase the contact area of the source/drain structures and the channel region 6. Thus, the stressor source/drain structures may provide more strain on the channel region 6. Also, the embodiments can reduce the short channel effects (SCE) of the FinFET device 1. The diverging source/drain facets 22 may help to prevent punch through below the channel region 6. Further, the lightly doped region 26 may help to prevent leakage current between the source/drain structures and the channel region 6.

An embodiment is a FinFET device. The FinFET device comprises a fin, a first source/drain region, a second source/drain region, and a channel region. The fin is raised above a substrate. The first source/drain region and the second source/drain region are in the fin. The channel region is laterally between the first and second source/drain regions. The channel region has facets that are not parallel and not perpendicular to a top surface of the substrate.

Another embodiment is a FinFET device. The FinFET device comprises a fin, a first source/drain region, a second source/drain region, a channel region, etch control sections, and a gate structure. The fin extends from a top surface of a substrate. The first source/drain region, the second source/drain region, the etch control sections, and the channel region are in the fin. The etch control sections are laterally adjacent the first and second source/drain. The channel region is laterally between the etch control sections. The gate structure is over the channel region and the etch control sections.

A further embodiment is a method for forming a FinFET device. The method comprises forming a fin on a substrate and etching recesses into the fin, wherein the etching the recesses forms etch control sections laterally adjacent the recesses, the etch control sections laterally between a channel region and the respective recess. The method further comprises etching the etch control sections, wherein the etching the etch control sections forms facets in the etch control sections and the channel region, the facets being not parallel and not perpendicular to a top surface of the substrate.

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A FinFET device comprising:
  a fin extending from a top surface of a substrate;
  a first source/drain region in the fin;
  a second source/drain region in the fin;
  etch control sections in the fin, the etch control sections laterally adjacent the first and second source/drain regions, wherein the first and second source/drain regions each have facets undercutting a channel region and the etch control sections, the facets being not parallel and not perpendicular to the top surface of the substrate;
  the channel region in the fin, the channel region laterally between the etch control sections; and
  a gate structure over the channel region and the etch control sections.

2. The FinFET device of claim 1, wherein the etch control sections and the channel region form facets that are not parallel and not perpendicular to the top surface of the substrate.

3. The FinFET device of claim 2 further comprising:
  lightly doped regions in the first and second source/drain regions;
  heavily doped regions in the lightly doped regions, the lightly doped regions extending between the facets and the heavily doped regions; and
  an etch stop layer over and adjoining each of the first and second source/drain regions and the gate structure.

4. The FinFET device of claim 3 further comprising:
  an inter-layer dielectric layer over the etch stop layer; and
  a plurality of contacts through the inter-layer dielectric layer, one of the plurality of contacts corresponding and electrically coupled to each of the first and second source/drain regions and the gate structure.

5. The FinFET device of claim 1, wherein the etch control sections have a substantially triangular shape.

6. The FinFET device of claim 1, wherein the etch control sections are doped with boron.

7. A FinFET device comprising:
a fin over a substrate;
a channel region in the fin;
etch control sections in the fin on opposing sides of the channel region, the etch control sections and the channel region forming facets;
source/drain regions in the fin on opposing sides of the etch control sections;
a gate dielectric over the channel region;
a gate electrode over the gate dielectric, the gate electrode directly overlying an intersection of the facets, the facets intersecting under the gate electrode being not parallel and not perpendicular to a major surface of the substrate; and
gate spacers on opposing sides of the gate electrode and gate dielectric.

8. The FinFET device of claim 7, wherein the gate spacers are directly overlying the etch control sections.

9. The FinFET device of claim 7, wherein the etch control sections have a material composition different than material compositions of both the channel region and the source/drain regions.

10. The FinFET device of claim 7, wherein the source/drain regions have facets undercutting the channel region and the etch control sections, the facets being not parallel and not perpendicular to a top surface of the substrate.

11. A FinFET device comprising:
a fin raised above a substrate;
a first source/drain region in the fin;
a second source/drain region in the fin;
a channel region between the first and second source/drain regions;
a first etch control section interposed between the first source/drain region and the channel region, the channel region and the first etch control section forming a first sidewall, the first sidewall having a first facet and a second facet, the first and second facets diverging from each other along a longitudinal axis of the fin in a direction away from the channel region; and
a second etch control section interposed between the second source/drain region and the channel region, the channel region and the second etch control section forming a second sidewall, the second sidewall having a third facet and a fourth facet, the third and fourth facets diverging from each other along the longitudinal axis of the fin in a direction away from the channel region.

12. The FinFET device of claim 11, wherein at least portions of each of the first, second, third, and fourth facets being at interfaces of the channel region and the first and second source/drain regions.

13. The FinFET device of claim 11, wherein the first, second, third, and fourth facets have a substantially (111) crystalline orientation.

14. The FinFET device of claim 11, wherein the first, second, third, and fourth facets are not parallel and not perpendicular to a major surface of the substrate.

15. The FinFET device of claim 11, wherein the first source/drain region further comprises a fifth facet undercutting the channel region, and wherein the second source/drain region further comprises a sixth facet undercutting the channel region, the fifth and sixth facets being not parallel and not perpendicular to a major surface of the substrate.

16. The FinFET device of claim 15, wherein the fifth and sixth facets diverge from each other in a direction away from the channel region.

17. The FinFET device of claim 15, wherein the fifth and sixth facets have a (111) crystalline orientation.

* * * * *